United States Patent
Hata

(10) Patent No.: US 12,557,667 B2
(45) Date of Patent: Feb. 17, 2026

(54) SEMICONDUCTOR DEVICE WITH LEAD FRAME HAVING AN OFFSET PORTION ON A DIE PAD

(71) Applicant: RENESAS ELECTRONICS CORPORATION, Tokyo (JP)

(72) Inventor: Toshiyuki Hata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 338 days.

(21) Appl. No.: 18/170,159

(22) Filed: Feb. 16, 2023

(65) Prior Publication Data

US 2023/0369178 A1    Nov. 16, 2023

(30) Foreign Application Priority Data

May 10, 2022   (JP) ................. 2022-077474

(51) Int. Cl.
| | |
|---|---|
| H01L 23/495 | (2006.01) |
| H01L 23/00 | (2006.01) |
| H01L 23/31 | (2006.01) |
| H01L 23/498 | (2006.01) |
| H01L 25/065 | (2023.01) |

(52) U.S. Cl.
CPC .... H01L 23/49513 (2013.01); H01L 23/3107 (2013.01); H01L 23/49548 (2013.01);
(Continued)

(58) Field of Classification Search
CPC ......... H01L 2924/181; H01L 23/49517; H01L 23/49513; H01L 23/49816; H01L 24/32;
(Continued)

(56) References Cited

U.S. PATENT DOCUMENTS

| | | | | |
|---|---|---|---|---|
| 8,232,629 | B2 * | 7/2012 | Koike | ..................... H01L 24/05 257/691 |
| 2002/0084518 | A1 * | 7/2002 | Hasebe | ............... H01L 23/3107 257/784 |
| 2011/0215400 | A1 | 9/2011 | Nakamura et al. | |
| 2014/0353809 | A1 | 12/2014 | Shimizu et al. | |
| 2015/0206830 | A1 | 7/2015 | Takada et al. | |
| 2017/0309547 | A1 * | 10/2017 | Shimizu | .................. H01L 24/32 |

FOREIGN PATENT DOCUMENTS

| | | |
|---|---|---|
| JP | S53-115175 A | 10/1978 |
| JP | S61-119343 U | 7/1986 |

(Continued)

OTHER PUBLICATIONS

Office Action issued in counterpart Japanese Patent Application No. 2022-077474, dated Apr. 22, 2025.
Office Action dated Aug. 12, 2025, issued in corresponding Japan Application No. 2022-077474, 9 pages.
(Continued)

*Primary Examiner* — Alonzo Chambliss
(74) *Attorney, Agent, or Firm* — Rimon P.C.

(57) ABSTRACT

A package construction includes: a die pad, and a suspension lead remaining portion connected to the die pad. Here, an offset portion is provided from a peripheral edge portion of the die pad to the suspension lead remaining portion. Also, the suspension lead remaining portion has: a first end portion connected to the die pad, and a second end portion opposite the first end portion. Further, the second end portion of the suspension lead remaining portion is exposed from the side surface of the sealing body at a position spaced apart from each of the upper surface and the lower surface.

2 Claims, 28 Drawing Sheets

(52) U.S. Cl.
CPC .. *H01L 23/49575* (2013.01); *H01L 23/49816* (2013.01); *H01L 24/08* (2013.01); *H01L 24/32* (2013.01); *H01L 24/48* (2013.01); *H01L 24/49* (2013.01); *H01L 25/0655* (2013.01); *H01L 2224/08055* (2013.01); *H01L 2224/08113* (2013.01); *H01L 2224/32245* (2013.01); *H01L 2224/4814* (2013.01); *H01L 2224/48245* (2013.01); *H01L 2224/4903* (2013.01); *H01L 2924/182* (2013.01)

(58) Field of Classification Search
CPC ......... H01L 24/49; H01L 24/08; H01L 24/48; H01L 25/0655; H01L 23/49503; H01L 23/49548; H01L 23/49575; H01L 23/3107; H01L 2224/4814
See application file for complete search history.

(56) References Cited

FOREIGN PATENT DOCUMENTS

| | | |
|---|---|---|
| JP | H10-233479 A | 9/1998 |
| JP | 2008-060256 A | 3/2008 |
| JP | 2010-109253 A | 5/2010 |
| JP | 2011-187650 A | 9/2011 |
| JP | 2014-232811 A | 12/2014 |
| JP | 2018-174232 A | 11/2018 |
| WO | 2014/045435 A1 | 3/2014 |

OTHER PUBLICATIONS

Notice of Reasons for Refusal issued in corresponding Japanese Patent Application No. 2022-077474, dated Dec. 23, 2025.

* cited by examiner

FIG. 11

| | Chip Size | Ratio |
|---|---|---|
| Prior Art | 3.6mm × 3.6mm = 12.96mm² | 100% |
| Related Art | 3.8mm × 3.8mm = 14.44mm² | 110% |
| Basic Idea | 4.0mm × 4.0mm = 16.0mm² | 123% |

SEMICONDUCTOR DEVICE WITH LEAD FRAME HAVING AN OFFSET PORTION ON A DIE PAD

CROSS-REFERENCE TO RELATED APPLICATIONS

The disclosure of Japanese Patent Application No. 2022-077474 filed on May 10, 2022, including the specification, drawings and abstract is incorporated herein by reference in its entirety.

BACKGROUND

The present invention relates to a semiconductor device, and more particularly, to a technique applicable to a semiconductor device including a semiconductor chip mounted on a die pad via a conductive adhesive material.

Here, there are disclosed techniques listed below.
[Patent Document 1] Japanese Unexamined Patent Application Publication No. 2008-60256

Patent Document 1 discloses a technique in which an end portion of a chip mounting surface of a die pad is set higher than an upper surface of a chip.

SUMMARY

For example, in a semiconductor chip in which a power transistor is formed, it can be said that a performance of the semiconductor chip is better as a chip size of the semiconductor chip is increased.

This is because an increase of the chip size of the semiconductor chip means a decrease of the ON-resistance of the power transistor formed in the semiconductor chip.

On the other hand, since a package size of a semiconductor device sealing the semiconductor chip is determined by the standard, the package size cannot be increased immoderately. As a result, a size of the die pad on which the semiconductor chip is mounted is not significantly different from a size of the die pad used by other companies in the same industry. Therefore, it is important to mount a how large semiconducting chip on the die pad so as to provide a semiconductor device with an excellent performance. That is, in order to provide the semiconductor device with the excellent performance, an idea for mounting a larger semiconductor chip on the die pad is desired.

A semiconductor device according to one embodiment, includes: a die pad; a lead spaced apart from the die pad; a suspension lead remaining portion connected to the die pad; a semiconductor chip mounted on the die pad via a conductive adhesive material; a conductive member electrically connecting the semiconductor chip and the lead with each other; and a sealing body having an upper surface, a lower surface opposite the upper surface and a side surface located between the upper surface and the lower surface. Also, the sealing body seals the semiconductor chip and the lead such that a part of the die pad is exposed from the lower surface. Here, an offset portion is provided from a peripheral edge portion of the die pad to the suspension lead remaining portion. Also, the suspension lead remaining portion has: a first end portion connected to the die pad; and a second end portion opposite the first end portion. Further, the second end portion of the suspension lead remaining portion is exposed from the side surface of the sealing body at a position spaced apart from each of the upper surface and the lower surface.

A semiconductor device according to one embodiment, includes: a die pad; a lead spaced apart from the die pad; a header connected to the die pad; a semiconductor chip mounted on the die pad via a conductive adhesive material; a conductive member electrically connecting the semiconductor chip and the lead with each other; and a sealing body having an upper surface, a lower surface opposite the upper surface and a side surface located between the upper surface and the lower surface. Also, the sealing body seals the semiconductor chip and the lead such that a part of the die pad is exposed from the lower surface. Here, the die pad has: a first side connected to the header; a second side facing the first side; a third side crossing each of the first side and the second side; and a fourth side facing the third side. Also, a groove portion is provided along the first side of the die pad at a connecting portion of the die pad. The connecting portion of the die pad is a portion connected to the header. Further, a third offset portion is provided along the third side, and a fourth offset portion is provided along the fourth side.

According to one embodiment, the performance of the semiconductor device can be improved.

BRIEF DESCRIPTION OF THE DRAWINGS

FIG. 11 is a table showing a comparison result of a chip area.

DETAILED DESCRIPTION

Figure 1:
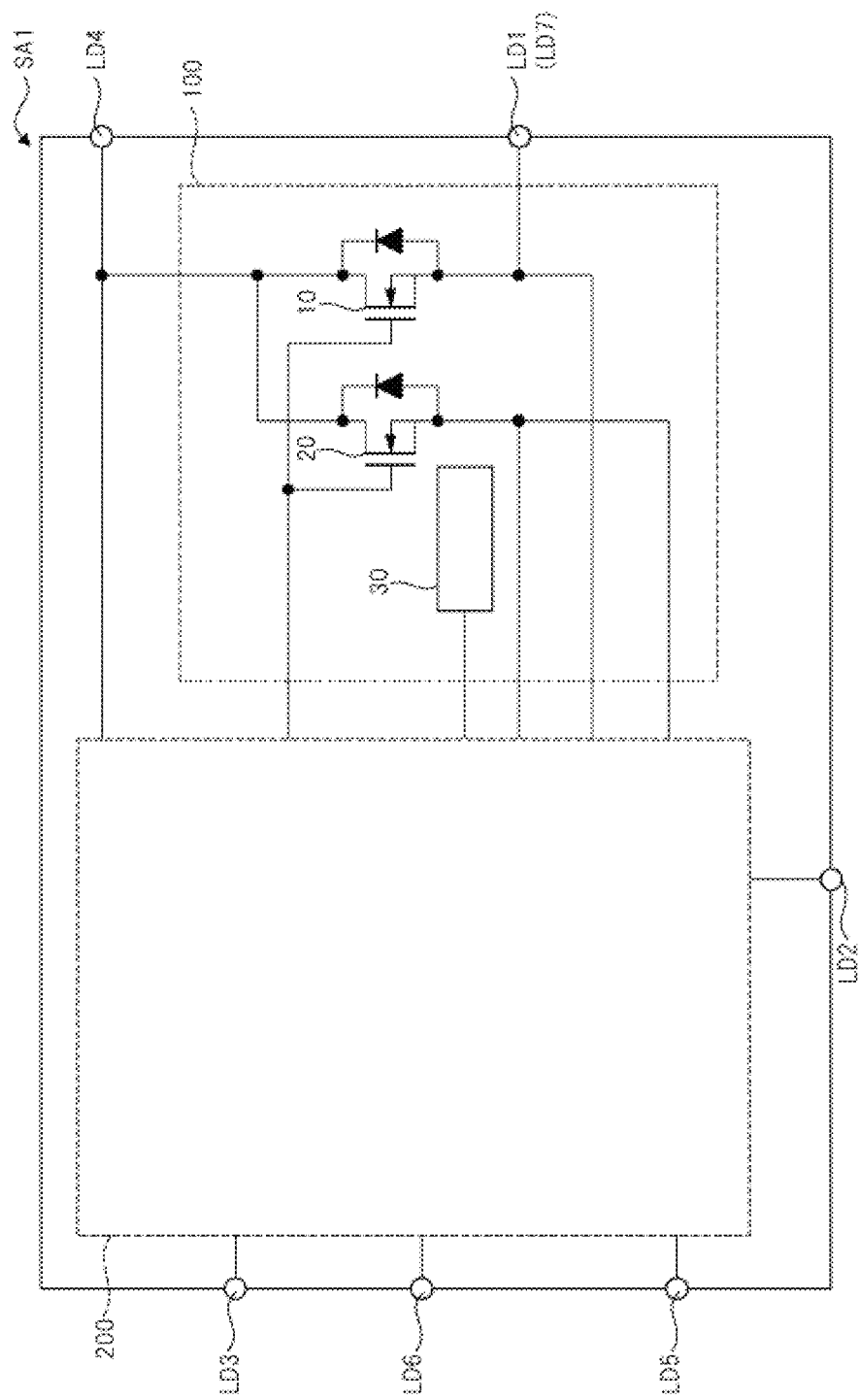
FIG. 1 shows a circuit configuration of a semiconductor device including a power transistor and a control circuit for controlling the power transistor.

In all the drawings for explaining the embodiments, the same members are denoted by the same reference numerals in principle, and repetitive descriptions thereof are omitted. Note that even plan view may be hatched for the sake of clarity.

<Configuration of Each of Power Transistor and Control Circuit>

FIG. 1 shows a circuit configuration of a semiconductor device SA1 including a power transistor and a control circuit for controlling the power transistor.

In FIG. 1, the semiconductor device SA1 includes a switching circuit 100 and a control circuit 200, and the switching circuit 100 includes a main transistor 10 including a power transistor, a sense transistor 20, and a temperature sensor 30.

In the switching circuit 100 configured as described above, the main transistor 10 is provided between a lead LD4 which is a power supply terminal for supplying a power supply potential and a lead LD1 (lead LD7) which is an output terminal, and functions as a switching element for turning ON/OFF a current flowing between the power supply terminal and the output terminal. On the other hand, the sense transistor 20 has a function of detecting a current value of a current flowing through the main transistor 10, and the temperature sensor (thermal sensor) 30 has a function of detecting the temperature of the switching circuit 100.

Subsequently, the control circuit 200 has a function of controlling the switching circuit 100, and includes, for example, a pre-driver that applies a gate voltage to the gate electrode of the main transistor 10 and the gate electrode of the sense transistor 20. In FIG. 1, the control circuit 200 is electrically connected to a lead LD3 which is an input terminal of the semiconductor device SA1, a lead LD6, a lead LD2 which is a ground terminal, and a lead LD5 which is an output terminal for outputting an output from the control circuit 200 to the outside of the semiconductor device SA1.

The control circuit 200 is configured to control ON/OFF of the main transistor 10 included in the switching circuit 100 based on a control signal inputted from the read LD3.

That is, the control circuit 200 controls ON/OFF of the main transistor 10 by switching the gate voltage applied to the gate electrode of the main transistor 10.

In this way, by the ON/OFF control of the main transistor 10, a current can be supplied from the lead LD1, which is an output terminal electrically connected to the source of the main transistor 10, to a load connected to the outside of semiconductor device SA1.

The semiconductor device SA1 is configured as described above.

<Study for Improvement>

In the above-described semiconductor device SA1, the switching circuit 100 and the control circuit 200 are formed on semiconductor chips, respectively, and these semiconductor chips are mounted on a die pad via a conductive adhesive material represented by solder or silver paste. Specifically, after the conductive adhesive material is supplied onto the die pad, the semiconductor chip is mounted on the die pad.

Here, when the conductive adhesive material is supplied onto the die pad, the conductive adhesive material melts and spreads on the die pad. The spreading of the conductive adhesive material is adjusted by the supply amount of the conductive adhesive material. At this time, when the supply amount of the conductive adhesive material is reduced, the thickness of the conductive adhesive material tends to be reduced. When the thickness of the conductive adhesive material is reduced, the temperature cycle test is affected. Therefore, it is necessary to secure the thickness of the conductive adhesive material by supplying a certain amount of the conductive adhesive material.

However, when the semiconductor chip is mounted on the die pad by increasing the supply amount of the conductive adhesive material in order to ensure a constant thickness, there is an increased possibility that the conductive adhesive material overflows from the die pad. Therefore, in order to prevent the conductive adhesive material from overflowing from the die pad while securing the thickness of the conductive adhesive material, it is necessary to reduce the size of the semiconductor chip mounted on the die pad. In other words, in order to prevent the conductive adhesive material from overflowing from the die pad while securing the thickness of the conductive adhesive material, the size of the semiconductor chip mounted on the die pad cannot be increased.

In this regard, for example, in a semiconductor chip in which the switching circuit 100 including the power transistor is formed, it can be said that the performance is better as the chip size of the semiconductor chip is larger. This is because an increase in the chip size of the semiconductor chip means a decrease in the ON-resistance of the power transistor formed on the semiconductor chip. On the other hand, the package size of the semiconductor device for sealing the semiconductor chip has been determined by the standard, and it is not possible to increase the package size inevitably. As a result, in order to provide the semiconductor device with the excellent performance, it is a key to mount a how large semiconductor chip on the die pad without changing the size of the die pad on which the semiconductor chip is to be mounted. In other words, in order to provide the semiconductor device with the excellent performance, an idea for mounting a larger semiconductor chip on the die pad is desired.

However, in the prior art, in order to prevent the conductive adhesive material from overflowing from the die pad while securing the thickness of the conductive adhesive material, it is not possible to increase the size of the semiconductor chip mounted on the die pad. In this regard, as a technique for suppressing the overflow of the conductive adhesive material from the die pad while securing the thickness of the conductive adhesive material, the following related techniques exist, and therefore the related art will be described.

Description of Related Art

The "related art" referred in this specification is not a known art, but is a technology having the problems found by the present inventor, and is a technology that is a premise of the present invention.

Figure 2:
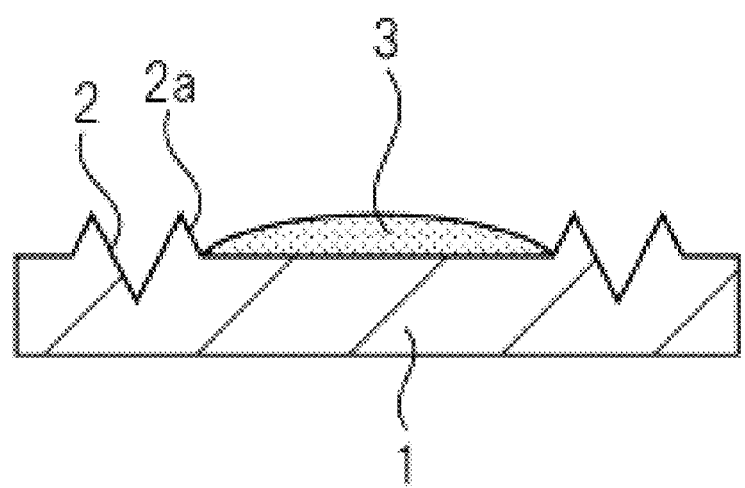
FIG. 2 is a diagram showing a state of supplying a conductive adhesive material onto a die pad of the related art.

FIG. 2 is a schematic view showing a state in which the conductive adhesive material 3 is supplied onto the die pad 1 in the related art. In FIG. 2, a groove 2 is provided on the surface of the die pad 1, and the wet spreading of the conductive adhesive material 3 is blocked by the groove 2. As a result, according to the related art, it is possible to suppress the overflow of the conductive adhesive material 3 from the die pad 1.

Figure 3:
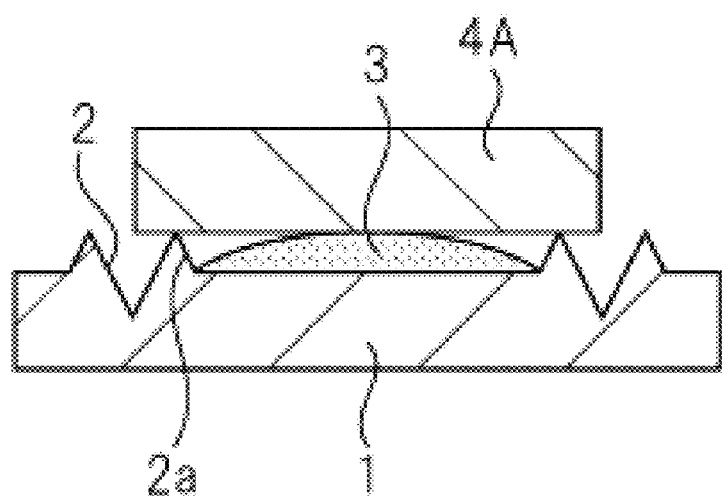
FIG. 3 is a diagram showing a state of mounting a semiconductor chip on the die pad of the related art.

However, since the groove 2 is formed by a stamping process, a raised portion 2a is formed around the groove 2 as shown in FIG. 2. Therefore, as shown in FIG. 3, when a semiconductor chip 4A having a large chip size is mounted on the die pad 1, the semiconductor chip 4A rides on the raised portion 2a, and the semiconductor chip 4A and the conductive adhesive material 3 are defective. That is, it is difficult to ensure the reliability of connecting the semiconductor chip 4A and the conductive adhesive material 3 by the raised portion 2a. Further, since the wetting and spreading of the conductive adhesive material 3 to the lower surface of the semiconductor chip 4A becomes insufficient, the heat dissipation property of the semiconductor chip 4A also deteriorates.

Figure 4:
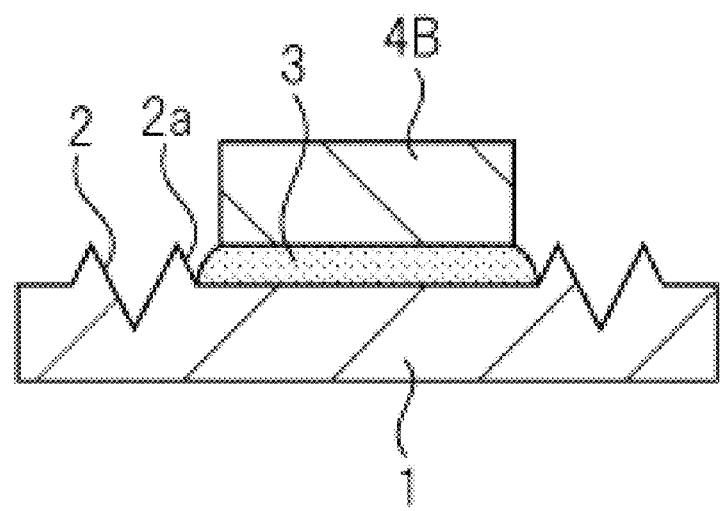
FIG. 4 is a diagram showing a state of mounting a semiconductor chip on the die pad of the related art.

Therefore, for example, as shown in FIG. 4, when the semiconductor chip 4B does not ride on the raised portion 2a, the chip size of the semiconductor chip 4B mounted on the die pad 1 is reduced. As described above, in the related art, by providing the groove 2 in the die pad 1, it is possible to prevent the conductive adhesive material 3 from overflowing from the die pad 1, but it is difficult to mount a large-size semiconductor chip on the die pad 1 due to the formation of the raised portion 2a. That is, in the related art, there is room for improvement from the viewpoint of achieving both of suppressing the overflow of the conductive adhesive material 3 from the die pad 1 and mounting the semiconductor chip 4A having the largest possible chip size on the die pad 1 while securing the connecting reliability and the heat dissipation property.

Therefore, the present embodiment has been devised to overcome the room for improvements that exist in the related art. In the following, the basic concept of the present embodiment with this contrivance will be described.

BASIC CONCEPT IN EMBODIMENT

Figure 5:
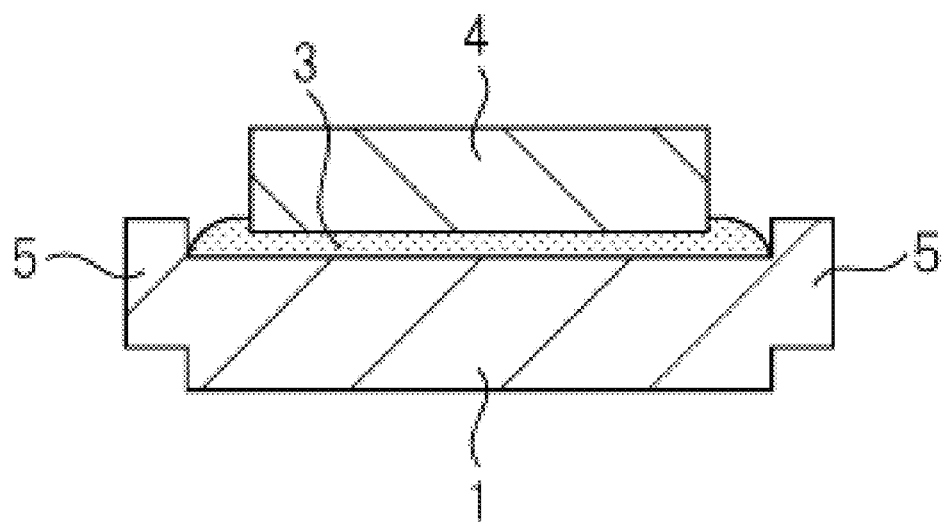
FIG. 5 is a diagram showing a state of mounting a semiconductor chip on a die pad of the basic concept.

The basic concept in the present embodiment is, for example, the idea of providing the offset portion 5 at the peripheral edge portion of the die pad 1 as shown in FIG. 5. Thus, a concave portion surrounded by the offset portion 5 is formed in the chip mounting surface of the die pad 1. As a result, the wetting and spreading of the conductive adhesive material 3 can be blocked by the offset portion 5 surrounding the concave portion. Therefore, even if the supply amount of the conductive adhesive material 3 is increased in order to ensure a constant thickness, it is possible to suppress the overflow of the conductive adhesive material 3 from the die pad 1.

Furthermore, according to the basic concept of the present embodiment, since the raised portion 2a as in the related art shown in FIG. 2 is not formed, the large-sized semiconductor chip 4 can be mounted on the die pad 1. In particular, in the basic concept, since the chip mounting surface of the die pad 1 is flat, it is possible to sufficiently spread the conductive adhesive material on the lower surface of the semiconductor chip 4, it is possible to secure the connection reliability between the semiconductor chip 4 and the die pad 1 and the heat dissipation characteristics of the semiconductor chip 4. As described above, the basic concept in the present embodiment can be said to be a very excellent technical idea in that, by providing the offset portion 5 at the peripheral edge portion of the die pad 1, the conductive adhesive material 3 can be suppressed from overflowing (i.e., bleedout) from the die pad 1, and the semiconductor chip 4 having the largest possible chip size can be mounted on the die pad 1 while securing the connection reliability and the heat dissipation characteristics.

Hereinafter, a method of providing the offset portion 5 in the peripheral edge portion of the die pad 1 will be described. Specifically, in the stamping process, there is a manufacturing technique called "half-punching", and this "half-punching" is used to form the offset portion 5 at the peripheral edge portion of the die pad 1.

Figure 6:
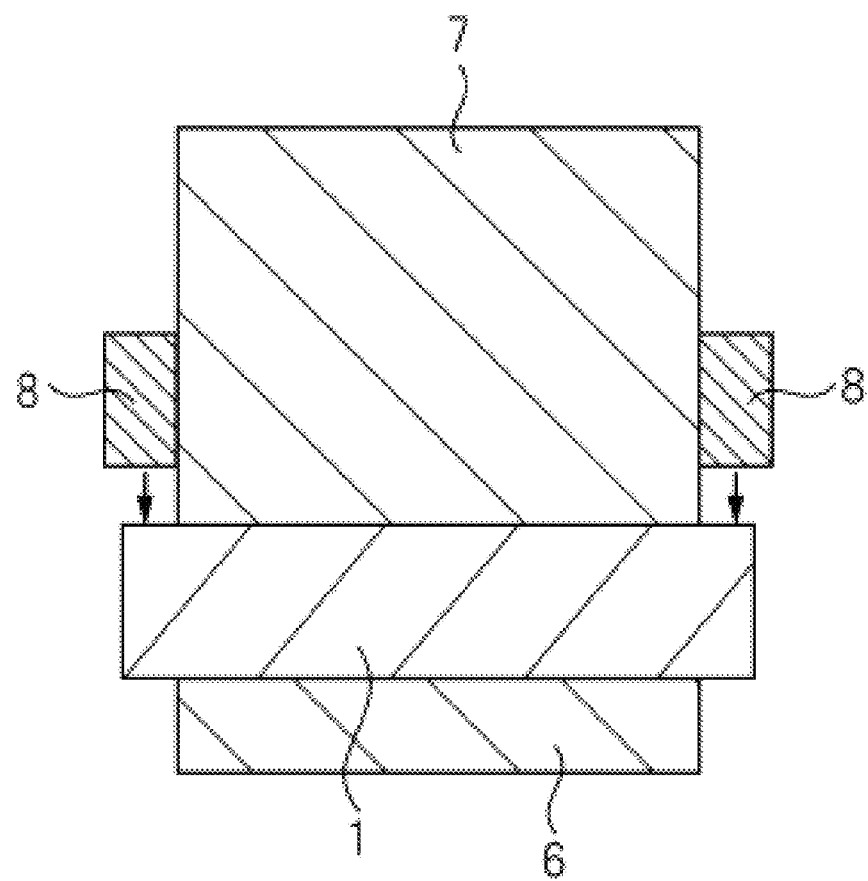
FIG. 6 is a diagram explaining a method of providing an offset portion in the die pad.
Figure 7:
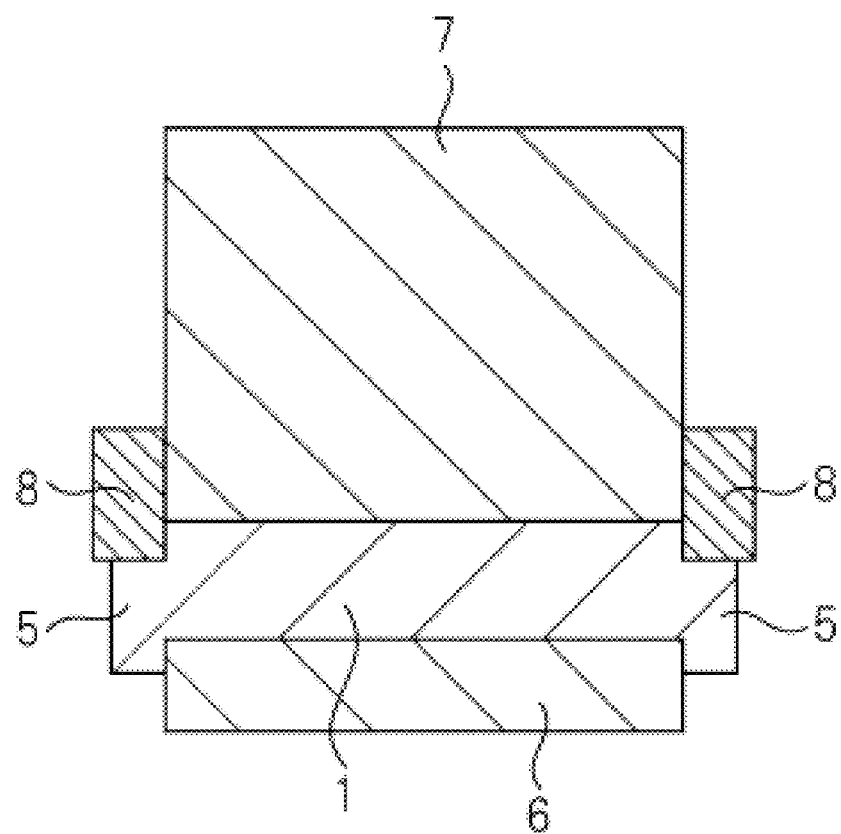
FIG. 7 is a diagram explaining the method of providing the offset portion in the die pad.
Figure 8:
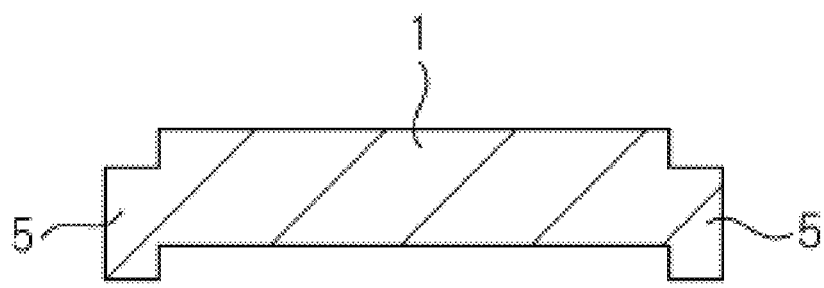
FIG. 8 is a diagram explaining the method of providing the offset portion in the die pad.
Figure 9:
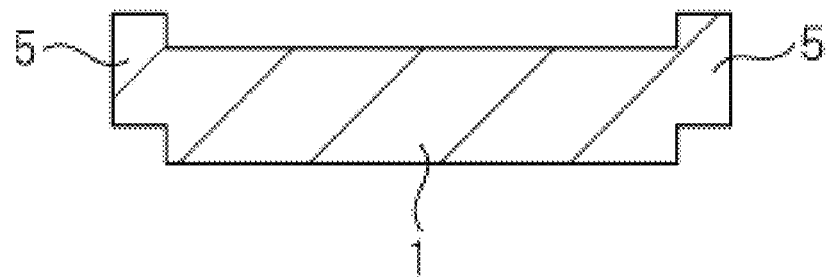
FIG. 9 is a diagram explaining the method of providing the offset portion in the die pad.

First, as shown in FIG. 6, the die pad 1 is sandwiched between the pressing die 6 and the pressing die 7. At this time, the peripheral edge portion of the die pad 1 protrudes. In this state, as shown in FIGS. 6 to 7, the punch 8 is pressed against the peripheral edge portion of the protruding die pad 1. Here, the peripheral edge portion of the die pad 1 is not punched out by the punch 8, but is stopped on the way. At this time, since the lower surface of the die pad 1 is pressed by the pressing die 6, the raised portion is not formed on the lower surface of the die pad 1 even when "half-cut" is performed by the punch 8. As a result, as shown in FIG. 8, the offset portion 5 is formed in the die pad 1. In practice, the die pad 1 formed as shown in FIG. 8 is inverted. Thus, the die pad 1 having the concave portion surrounded by the offset portion 5 shown in FIG. 9 can be manufactured. According to the die pad 1 manufactured in this way, since it has a large recess surrounded by the offset portion 5, it is possible to dispose a semiconductor chip having a large chip size in this recess.

From the above, according to the basic concept, by providing the offset portion 5 in the peripheral edge portion of the die pad 1, it is possible to both suppress the overflow of the conductive adhesive material 3 from the die pad 1, and to mount the semiconductor chip 4 of the chip size as large as possible on the die pad 1 while securing the connection reliability and the heat dissipation characteristics.

Next, the usefulness of the basic concept will be described.

FIG. 10 is a diagram showing a comparison between the prior art, the related art, and the basic concept.

Figure 10A:
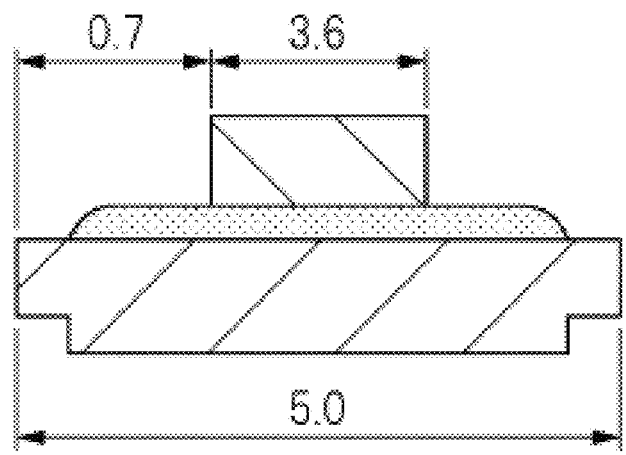
FIG. 10A is a diagram showing a state in which a semiconductor chip is mounted on a die pad of the prior art.
Figure 10B:
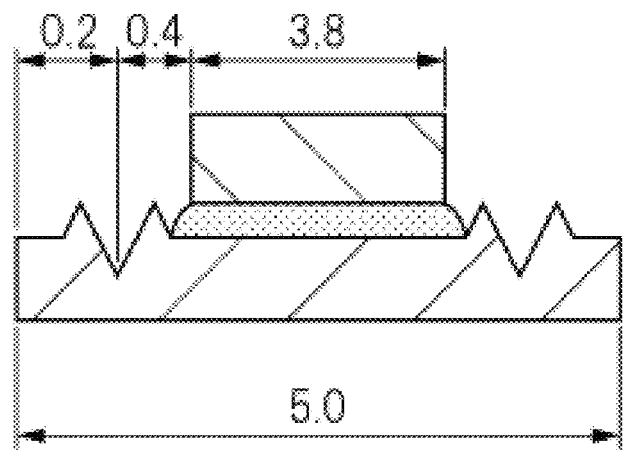
FIG. 10B is a diagram showing a state in which a semiconductor chip is mounted on a die pad of the related art.
Figure 10C:
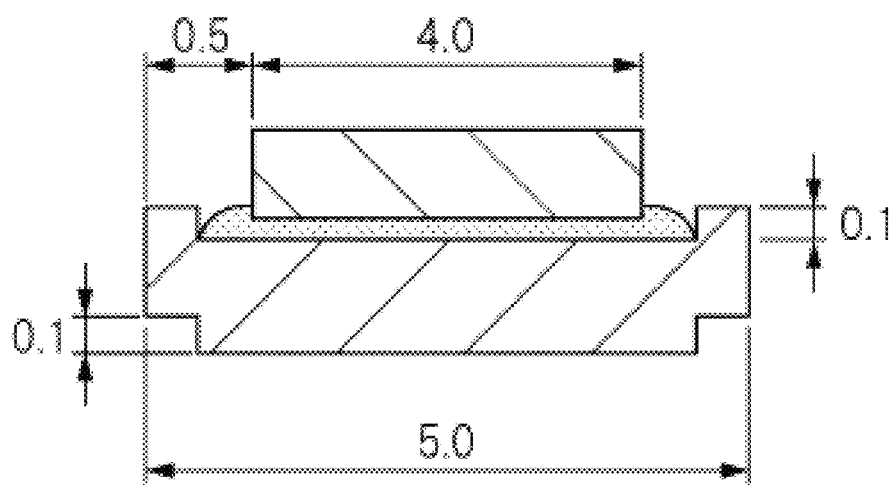
FIG. 10C is a diagram showing a state in which a semiconductor chip is mounted on a die pad of the basic concept.

In particular, FIG. 10A is a diagram showing a state in which a semiconductor chip is mounted on a die pad in the prior art. FIG. 10B is a diagram showing a state in which a semiconductor chip is mounted on a die pad in the related art. FIG. 10C is a diagram showing a state in which a semiconductor chip is mounted on a die pad in the basic concept.

In each of FIG. 10A, FIG. 10B and FIG. 10C, the width of the die pad is "5.0 mm" and the same width as each other. At this time, in the prior art shown in FIG. 10A, the width of the semiconductor chip mounted on the die pad is "3.6 mm", and the clearance is "0.7 mm". On the other hand, in the related art shown in FIG. 10B, the width of the semiconductor chip mounted on the die pad is "3.8 mm", and the clearance is "0.2 mm+0.4 mm=0.6 mm". Further, in the basic concept in the present embodiment shown in FIG. 10C, the width of the semiconductor chip mounted on a die pad is "4.0 mm", and clearance is "0.5 mm."

From the above, it can be seen that according to the basic concept, the semiconductor chip having the width larger than the width of the semiconductor chip shown in the prior art or the related art can be mounted. In particular, assuming that the planar shape of the semiconductor chip is square, as shown in FIG. 11, in the prior art, the chip area of the semiconductor chip mounted on the die pad is "12.96 mm$^2$". On the other hand, in the related art, the chip area of the semiconductor chip mounted on the die pad is "14.44 mm$^2$". Further, in the basic concept, the chip area of the semiconductor chip mounted on the die pad is "16.0 mm$^2$". Therefore, as shown in FIG. 11, when the chip area in the prior art is 100%, the chip area in the related art is 110%, and the chip area in the basic concept is 123%. As described above, the basic concept is more useful in that the chip area of the semiconductor chip mounted on the die pad can be increased than in the prior art or the related art.

Embodiments

<<Configuration of Semiconductor Device>>

Next, an embodiment in which the basic concept of the present embodiment described above is embodied will be described.

Figure 12A:
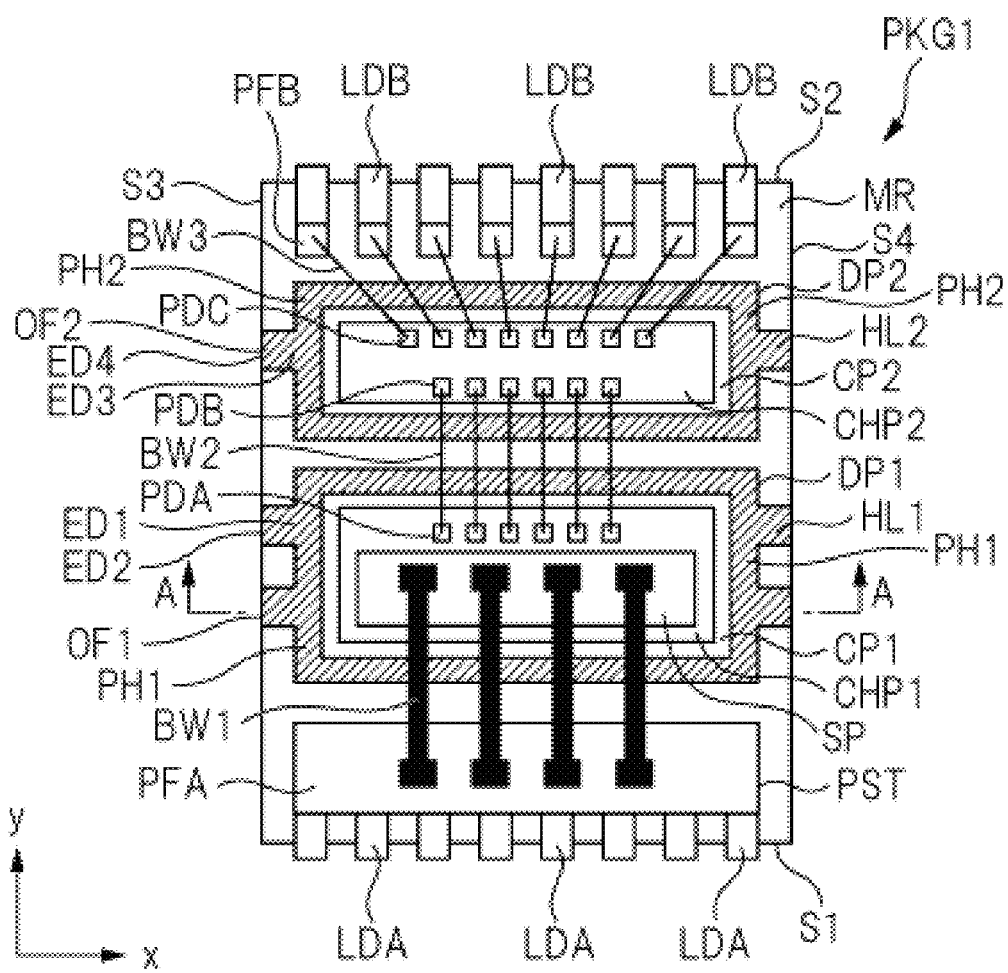
FIG. 12A is a diagram showing a package structure according to an embodiment and showing an upper surface of the package structure seen through a sealing body.
Figure 12B:
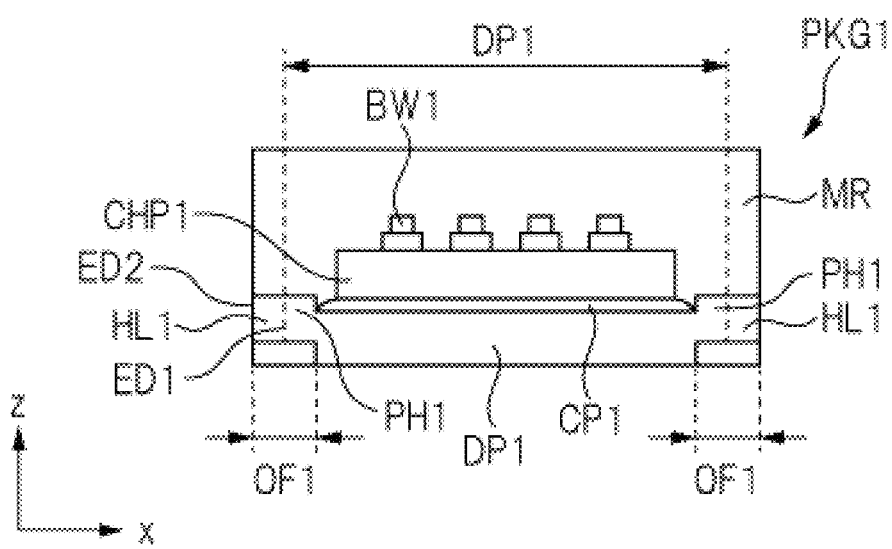
FIG. 12B is a cross-sectional view cut at a A-A line.

FIG. 12 is a diagram showing a package structure PKG1 in the present embodiment, and is a diagram showing an upper surface of the package structure PKG1 seen through the sealing body MR. In particular, FIG. 12A is plan view of the package structure PKG1, and FIG. 12B is cross-sectional view cut at A-A line.

As shown in FIG. 12A, the package structure PKG1 includes a die pad DP1 and a die pad DP2. The die pad DP1 is integrally formed with the suspension lead remaining portion HL1, and the die pad DP2 is integrally formed with the suspension lead remaining portion HL2. That is, the suspension lead remaining portion HL1 is connected to the die pad DP1, and the suspension lead remaining portion HL2 is connected to the die pad DP2. The suspension lead remaining portion HL1 has a first end portion ED1 connected to the die pad DP1 and a second end portion ED2 opposite the first end portion ED1. Similarly, the suspension lead remaining portion HL2 has a first end portion ED3 that leads to the die pad DP1 and a second end portion ED4 that opposite the first end portion ED3.

Here, the offset portion (diagonal area) OF1 is provided from the peripheral edge portion PH1 of the die pad DP1 to the suspension lead remaining portion HL1. Similarly, the offset portion (diagonal area) OF2 is provided from the peripheral edge portion PH2 of the die pad DP2 to the suspension lead remaining portion HL2.

On the die pad DP1, for example, a semiconductor chip CHP1 in which a power transistor is formed is mounted via a conductive adhesive material CP1. A source pad SP and a plurality of pads PDA are formed on the top surface of the semiconductor chip CHP1. On the other hand, on the die pad DP2, for example, a semiconductor chip CHP2 on which a control circuit for controlling a power transistor is formed is mounted via a conductive adhesive material CP2. A plurality of pads PDB and a plurality of pads PDC are formed on the top surface of the semiconductor chip CHP2.

Next, the package structure PKG1 has a plurality of leads LDA spaced apart from the die pad DP1. The plurality of leads LDA is also spaced apart from the die pad DP2 and the plurality of leads LDB. These plurality of leads LDA is integrated with the post portion PST. In other words, the plurality of leads LDA is connected to each other via the post portion PST. A nickel plating film PFA containing nickel as a main component is formed on the post portion PST. The plurality of leads LDA is arranged side by side in the x direction (first direction).

In addition, the package structure PKG1 includes a plurality of leads LDB spaced apart from the die pad DP2. The plurality of leads LDB is also spaced apart from the die pad DP1 and the plurality of leads LDA. The silver plating film PFB containing silver as a main component is formed at one end portion of each of the plurality of leads LDB. The plurality of leads LDB is also arranged side by side in the x direction.

Here, the plurality of leads LDA, the die pad DP1, the die pad DP2, and the plurality of leads LDB are arranged side by side in the y direction (second direction) intersecting the x direction in this order.

In the present specification, the term "main component" refers to the most abundant component, and is used to indicate that the inclusion of other components is not excluded. For example, "containing nickel as a main component" means containing the most amount of nickel, and similarly, "containing silver as a main component" means containing the most amount of silver.

Subsequently, as shown in FIG. 12A, the source pad SP formed on the semiconductor chip CHP1 and the post portion PST integrated with the plurality of leads LDA are electrically connected to each other via the plurality of bonding wires BW1.

Here, each of the plurality of bonding wires BW1 is made of aluminum-based material, and each of the plurality of bonding wires BW1 has a diameter of about 300 μm. At this time, since the nickel plating film PFA is formed on the front face of the post portion PST, the nickel plating film PFA is contacted with the bonding wire PST connected to the post portion BW1. Accordingly, the reliability of connecting the bonding wire BW1 and the post portion PST can be improved. That is, wire peeling can be suppressed by connecting the bonding wire BW1 to the nickel plating film PFA.

On the other hand, the plurality of pads PDA formed on the surface of the semiconductor chip CHP1 and the plurality of pads PDB formed on the surface of the semiconductor chip CHP2 are electrically connected to each other via the plurality of bonding wires BW2. Here, the bonding wire BW2 is made of gold as a main component, and has a diameter of about 25 μm.

Next, as shown in FIG. 12A, a plurality of pads PDC formed in the semiconductor chip CHP2 and a plurality of leads LDB are electrically connected to each other via a plurality of bonding wires BW3, respectively.

Here, each of the plurality of bonding wires BW3 is made of gold as a main component, and each of the plurality of bonding wires BW3 has a diameter of about 25 μm. At this time, since the silver plating film PFB is formed on one end portion of the lead LDB, the bonding wire BW3 connected to the lead LDB contacts the silver plating film PFB. Accordingly, the reliability of connecting the bonding wire BW3 and the lead LDB can be improved. In other words, by connecting the bonding wire BW3 to the silver plating film PFB, the wire peeling can be suppressed.

The semiconductor chip CHP1, the semiconductor chip CHP2, the post portion PST, a portion of each of the plurality of leads LDA, a portion of each of the plurality of leads LDB including one end portion, and the plurality of bonding wires BW1, BW2, BW3 are sealed with the sealing body MR.

The sealing body MR has an upper surface, a lower surface opposed to upper surface, and a side surface located between upper surface and the lower surface, and encapsulates the semiconductor chip CHP1, the semiconductor chip CHP2, and the leads such that a portion of the die pad DP1 and a portion of the die pad DP2 are exposed from the lower surface.

Here, as shown in FIG. 12A, the sealing body MR has rectangular planar shape, and has the first side S1 extending in the x direction, the second side S2 facing the first side S1, the third side S3 crossing each of the first side S1 and the second side S2, and the fourth side S4 facing the third side S3. At this time, the plurality of leads LDA is arranged along the first side S1 of the sealing body MR, and the other part of each of the plurality of leads LDA is exposed from only the first side S1. Similarly, the plurality of leads LDB is arranged along the second side S2 of the sealing body MR, and the other part of each of the plurality of leads LDB is exposed from only the first side S1.

In addition, the second end portion ED2 of the suspension lead remaining portion HL1 is exposed from the side surface of the sealing body MR at a position spaced apart from each of the upper surface of the sealing body MR and the lower surface of the sealing body MR. Similarly, the second end portion ED4 of the suspension lead remaining portion HL2 is exposed from the side surface of the sealing body MR at a position spaced apart from each of the upper surface of the sealing body MR and the lower surface of the sealing body MR.

Next, in FIG. 12B, a semiconductor chip CHP1 is mounted on the die pad DP1 via a conductive adhesive material CP1. Here, a offset portion OF1 is provided from the peripheral edge portion of the die pad DP1 to the suspension lead remaining portion HL1. The offset portion OF1 is a convex portion protruding upward from the die pad DP1, and is defined as a step-up portion. Further, as shown in FIG. 12B, in a cross-sectional view, the lower surface of the offset portion (=peripheral edge portion of die pad) OF1 is located between the upper surface (chip mounting surface, front surface) of the die pad (center portion of die pad, portion of die pad on which semiconductor chip is mounted) DP1 and the lower surface (surface exposed from sealing body, back surface) of the die pad DP1.

In addition, a conductive adhesive material CP1 is accumulated in the concave portion surrounded by the offset portion OF1, and the semiconductor chip CHP1 is mounted on the die pad DP1 via the conductive adhesive material CP1 so as to be enclosed in the concave portion in plan view. Note that, for example, the thickness of the offset portion OF1 is equal to the thickness of the die pad DP1.

Figure 13:
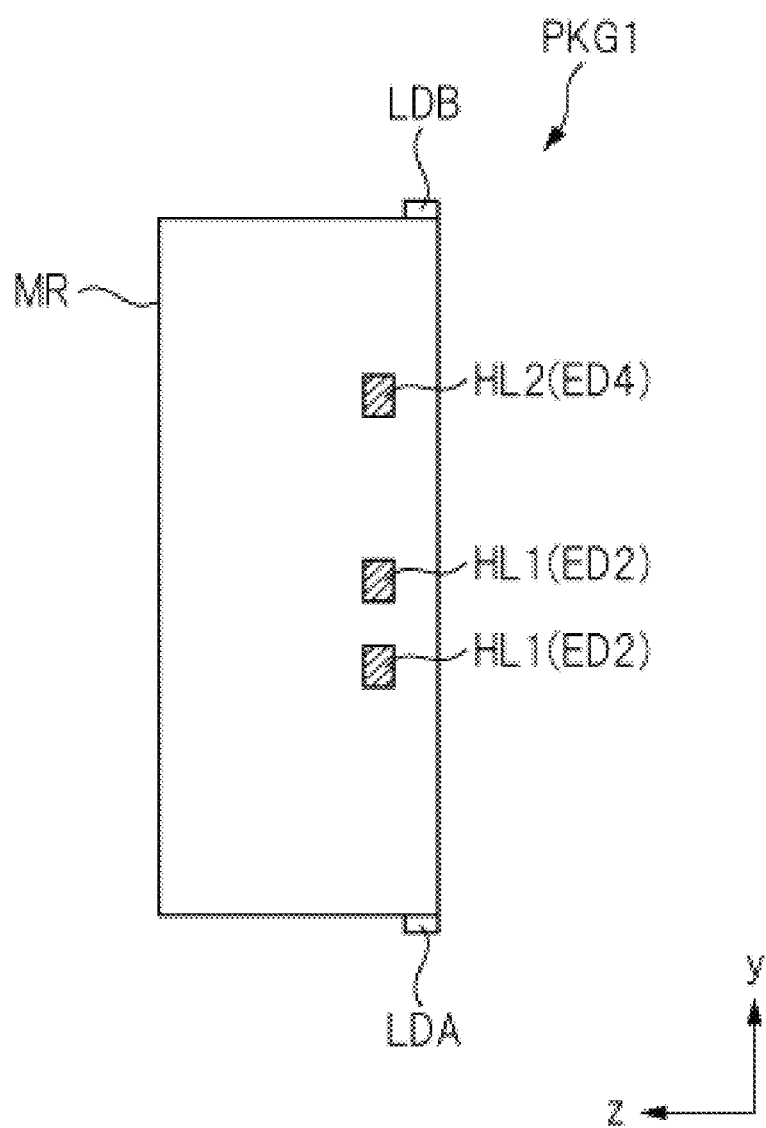
FIG. 13 is a side surface view of the package structure.

FIG. 13 is a side surface view of the package structure PKG1. As shown in FIG. 13, the suspension lead remaining portion HL1 and the suspension lead remaining portion HL2 are exposed from the side surface of the sealing body MR. In other words, it can be said that the suspension lead remaining portion HL1 and the suspension lead remaining portion HL2 are exposed from a position spaced apart from the lower surface of the sealing body MR.

Figure 14:
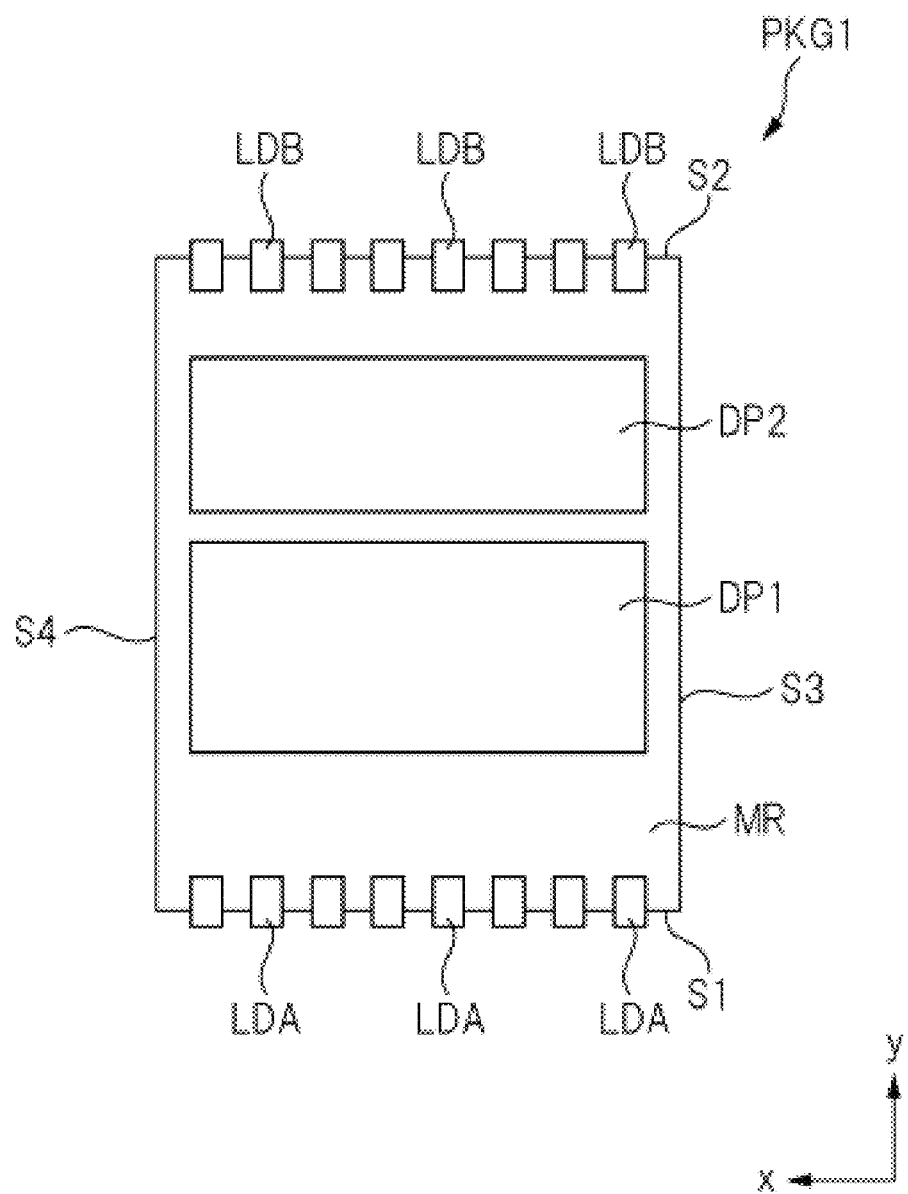
FIG. 14 is a lower surface view of the package structure.

Subsequently, FIG. 14 is a lower surface view of the package structure PKG1. As shown in FIG. 14, the lower surface of the die pad DP1 and the lower surface of the die pad DP2 are exposed from the rear surface (lower surface) of the sealing body MR. On the other hand, the suspension lead remaining portion HL1 connected to the die pad DP1 and the suspension lead remaining portion HL2 connected to the die pad DP2 are not exposed from the back surface of the sealing body MR. As described above, the package structure PKG1 is configured.

Here, as the package structure PKG1, a "SON (Small Outline Non-leaded package)" packaging is exemplified, but the basic concept in the present embodiment can also be embodied as a "SOP (Small Outline Package)" packaging.

Features in Embodiments

Next, characteristic points in the present embodiment will be described.

A characteristic point of the present embodiment is, for example, as shown in FIG. 12B, that the offset portion OF1 is provided not only at the peripheral edge portion of the die pad DP1 but also at the peripheral edge portion of the die pad DP1 and the suspension lead remaining portion HL1. As a result, the chip size of the semiconductor chip DP1 mounted on the die pad DP1 can be made larger than when the offset portion OF1 is provided only in the peripheral edge portion of the die pad C HP1.

For example, the package size of the semiconductor device that encapsulates a semiconductor chip is determined by a standard, and it is not possible to increase the package size unnecessarily. Consequently, how a larger semiconductor chip can be mounted on the die pad without changing the size of the die pad on which the semiconductor chip is mounted is a key to providing the semiconductor device with excellent performance.

Figure 15:
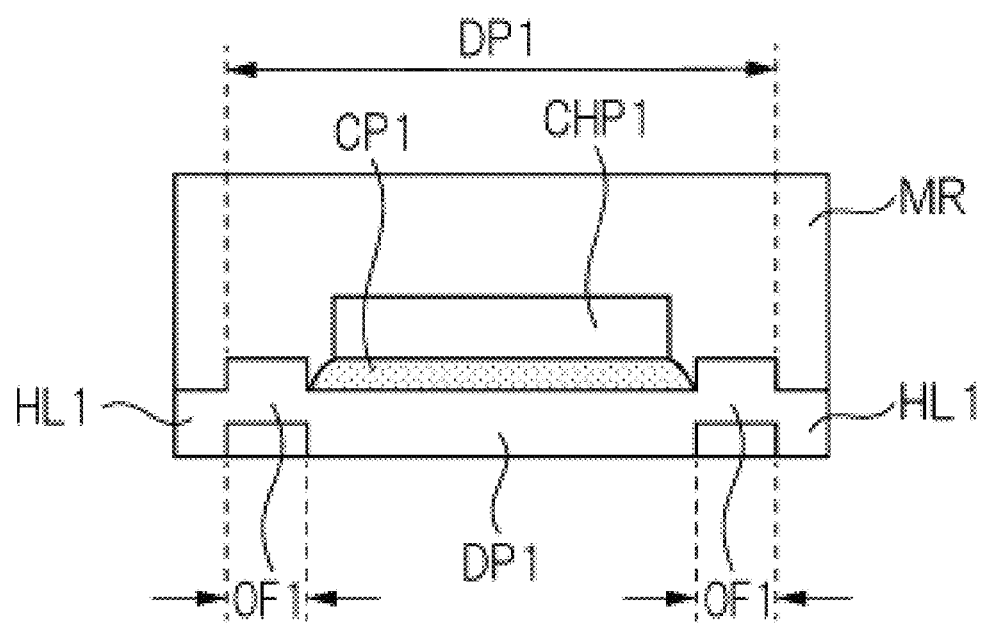
FIG. 15 is a diagram showing a construction in which an offset portion is provided at a peripheral edge portion of the die pad, but in which the offset portion is not provided at a suspension lead remaining portion.

About this point, FIG. 15 shows a structure (construction) in which the offset portion OF1 is provided at the peripheral edge part of die pad DP1, but in which the offset portion is not provided at the suspension lead remaining portion HL1. On the other hand, FIG. 16 shows a structure (construction) in which the offset portion OF1 is provided at not only the peripheral edge portion of the die pad DP1, but also from the peripheral edge portion of the die pad DP1 to the suspension lead remaining portion HL1.

Figure 16:
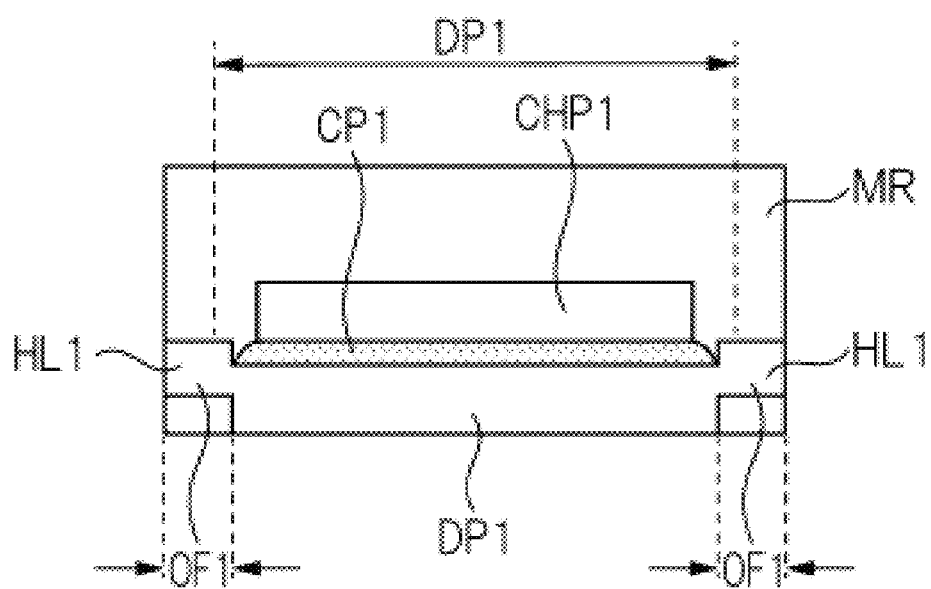
FIG. 16 is a diagram showing a construction in which the offset portion is provided at not only the peripheral edge portion of the die pad, but also from the peripheral edge portion of the die pad to the suspension lead remaining portion.

When FIG. 15 and FIG. 16 are compared, if the size of the die pad DP1 is the same, it can be seen that the structure shown in FIG. 16 can increase the chip size of the semiconductor chip CHP1 mounted on the die pad DP1 than the structure shown in FIG. 15.

That is, the chip size of the semiconductor chip DP1 mounted on the die pad DP1 can be increased according to the characteristic point of providing the peripheral edge portion of the die pad DP1 and the suspension lead remaining portion HL1 with the offset portion OF1 as well as the peripheral edge portion of the die pad the present embodiment. The fact that the chip size of the semiconductor chip CHP1 on which the power transistor is formed increases means that the ON-resistance of the power transistor can be reduced. Therefore, according to the present embodiment, the chip size of the semiconductor chip CHP1 mounted on the die pad DP1 can be increased, so that the performance of the semiconductor device can be finally improved.

As described above, the present embodiment adopts the basic concept of providing the offset portion OF1 at the peripheral edge portion of the die pad DP1, and further provides a contrivance (feature point) of providing the offset portion OF1 across the peripheral edge portion of the die pad DP1 and the suspension lead remaining portion HL1. Accordingly, according to the present embodiment, the chip size of the semiconductor chip CHP1 mounted on the die pad DP1 can be increased to the maximum without changing the size of the die pad DP1. In this regard, the above-described combination of the basic concept and the characteristic points has a great technical significance in realizing mounting of a semiconductor chip CHP1 having a chip size as large as possible on a die pad DP1.

When the characteristic point in the present embodiment is adopted, for example, the offset portion OF1 is also formed in the suspension lead remaining portion HL1. This means that, as shown in FIG. 13, the suspension lead remaining portion HL1 and the suspension lead remaining portion HL2 are exposed from a position farther from the lower surface of the sealing body MR. In other words, as shown in FIG. 14, this means that the suspension lead remaining portion HL1 connected to the die pad DP 1 and the suspension lead remaining portion HL2 connected to the die pad DP2 are not exposed from the back surface of the sealing body MR.

According to the present embodiment, the following advantages can be obtained. For example, the die pad DP1 exposed from the lower surface of the sealing body MR is electrically connected to the electrode of the mounting substrate via a conductive adhesive material. At this time, if the suspension lead remaining portion HL1 is also exposed from the lower surface of the sealing body MR, there is a possibility that the conductive adhesive material disposed between the die pad DP1 and the mounting substrate may protrude to the outer side of the semiconductor device through the exposed surface of the suspension lead remaining portion HL1 exposed from the sealing body MR.

On the other hand, in the present embodiment, the suspension lead remaining portion HL1 is not exposed from the lower surface of the sealing body MR. Therefore, according to the present embodiment, it is possible to prevent the conductive adhesive material disposed between the die pad DP1 and the mounting substrate from protruding outward of the semiconductor device through the suspension lead remaining portion HL1.

As described above, according to the features of the present embodiment, it is possible not only to increase the chip size of the semiconductor chip DP1 mounted on the die pad CHP1, but also to prevent the conductive adhesive material disposed between the die pad DP1 and the mounting substrate from protruding outward of the semiconductor device. That is, when the above-described characteristic points are adopted, the performance of the semiconductor device can be improved, and the reliability can be improved.

<<Method of Manufacturing Semiconductor Device>>

Next, a method of manufacturing the package structure (semiconductor device) PKG1 will be described.

Figure 17:
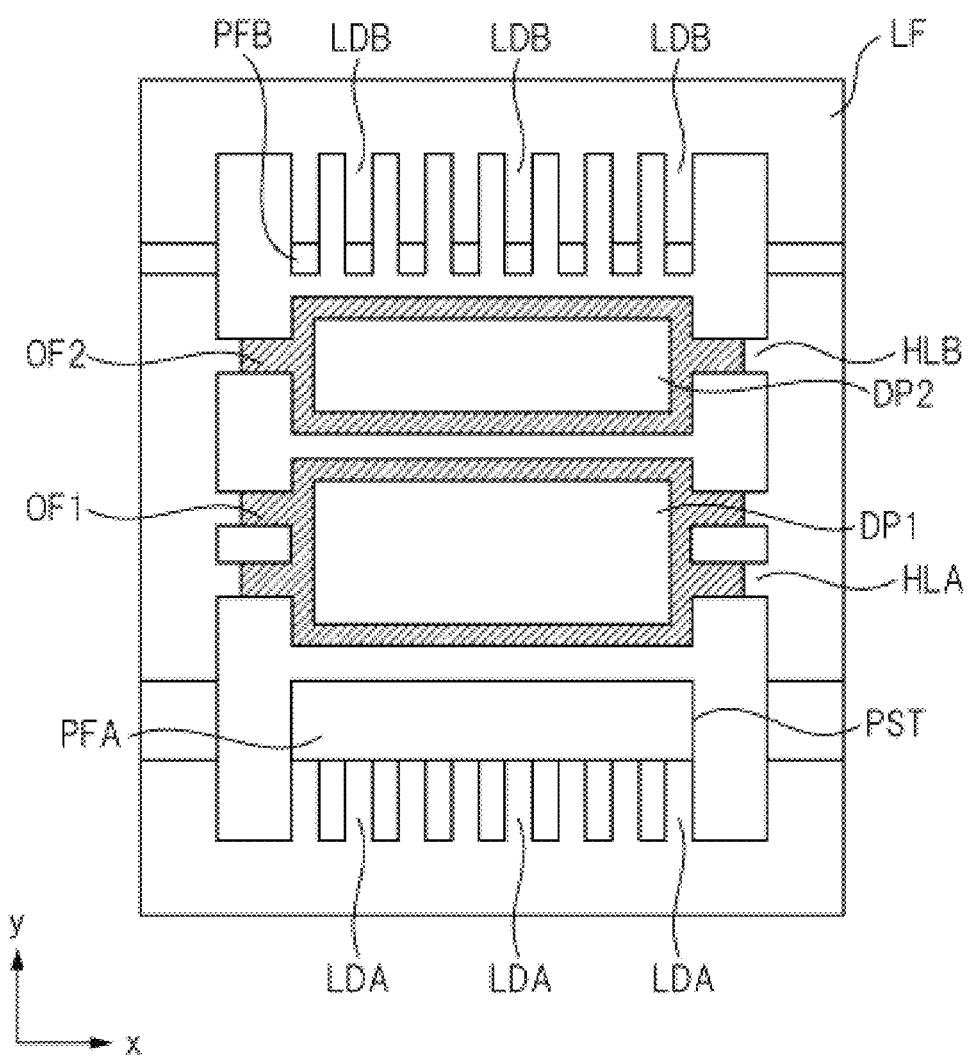
FIG. 17 is a diagram showing a manufacturing process of a semiconductor device according to the embodiment.

First, as shown in FIG. 17, a die pad DP1, a die pad D2, a plurality of leads LDA arranged in the x direction, and a plurality of leads LDB arranged in the x direction are formed in the lead frame LF. At this time, the plurality of leads LDA, the die pad DP1, the die pad DP2, and the plurality of leads LDB are arranged side by side in this order in the y direction intersecting the x direction.

The die pad DP1 is connected to the suspension lead HLA, while the die pad DP2 is connected to the suspension lead HLB. The offset portion OF1 is formed from a peripheral edge portion of the die pad DP1 to a portion of the suspension lead HLA. A region in which the offset portion OF1 is formed is indicated by a diagonal region. Similarly, an offset portion OF2 is formed from a peripheral edge portion of the die pad DP2 to a portion of the suspension lead HLB. A region in which the offset portion OF2 is formed is indicated by a diagonal region.

Further, the plurality of leads LDA are integrally formed with the post portion PST on which the nickel plating film PFA is formed. On the other hand, each of the plurality of leads LDB is formed so as to include, as one end portion, an area in which the silver plating film PFB is formed.

Figure 18:
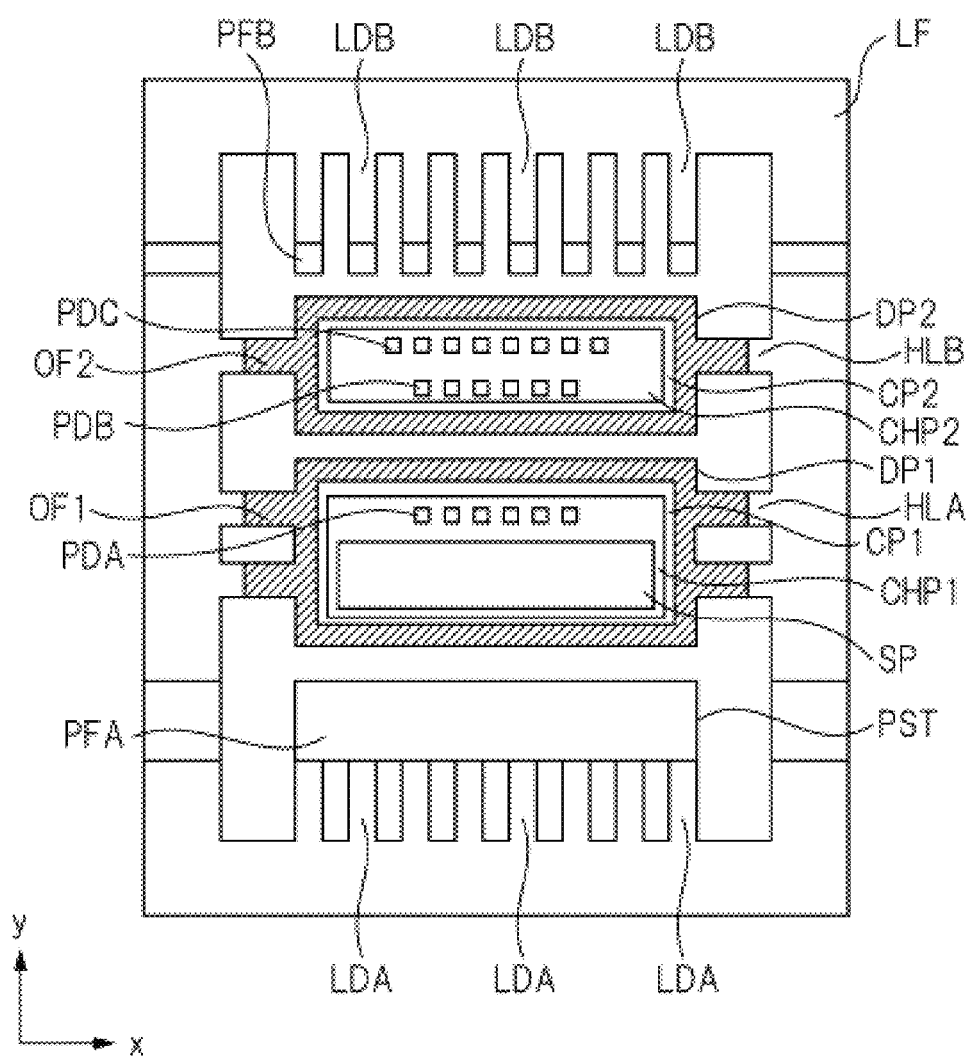
FIG. 18 is a diagram showing the manufacturing process of the semiconductor device followed by FIG. 17.

Next, as shown in FIG. 18, a semiconductor chip CHP1 on which a power transistor is formed is mounted on a die pad DP1. Specifically, on the die pad DP1, a conductive adhesive material CP1 made of silver paste, solder, or the like is applied on the die pad DP1, and then a semiconductor chip CHP1 is mounted via the conductive adhesive material CP1. Further, the semiconductor chip CHP2 on which the control circuitry is formed is mounted on the die pad DP2. Specifically, on the die pad DP2, a conductive adhesive CP2 made of silver paste, solder, or the like is applied on the die pad DP2, and then a semiconductor chip CHP2 is mounted via the conductive adhesive material CP2.

Figure 19:
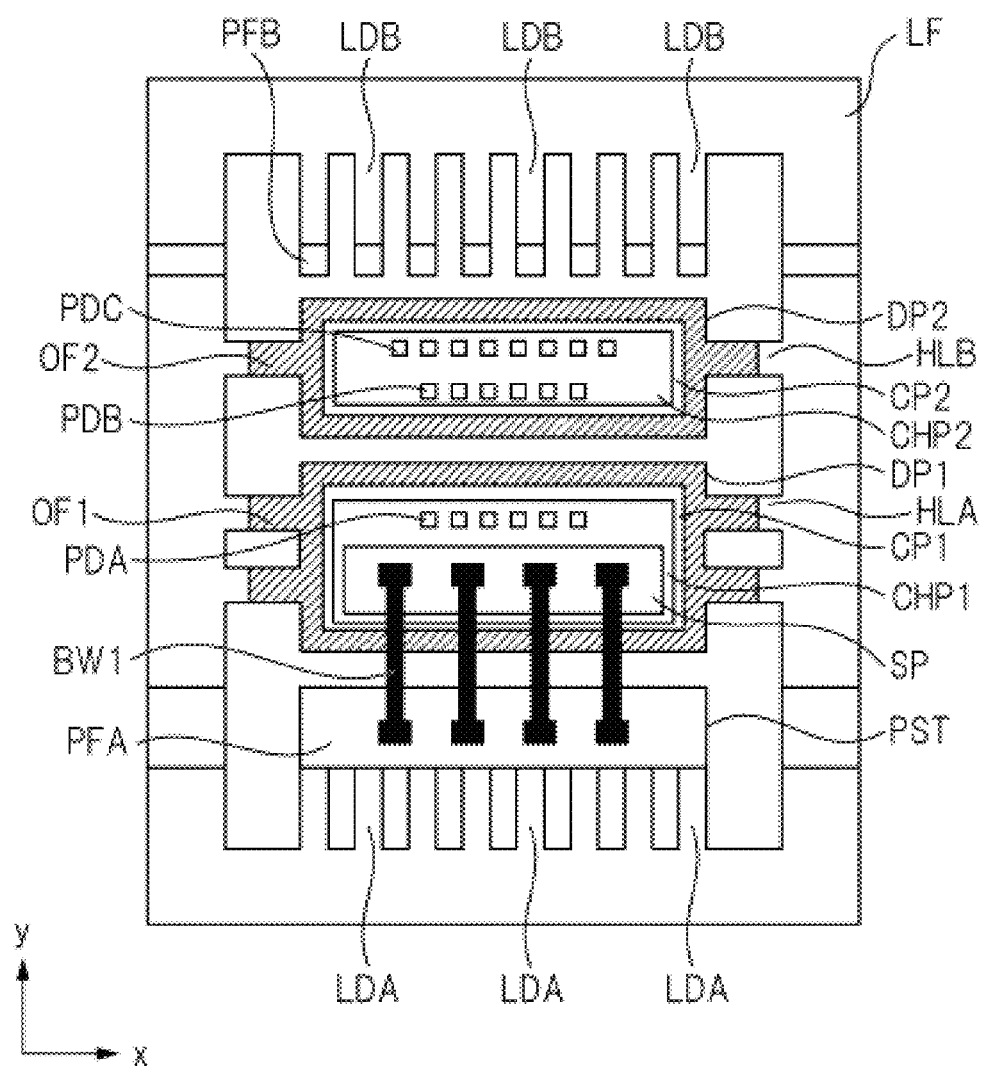
FIG. 19 is a diagram showing the manufacturing process of the semiconductor device followed by FIG. 18.

Thereafter, as shown in FIG. 19, the source pad SP formed on the front face of the semiconductor chip CHP1 and the post portion PST on which the nickel plating film PFA is formed are connected by a plurality of bonding wires BW1. At this time, each of the plurality of bonding wires BW1 is made of aluminum-based material.

Figure 20:
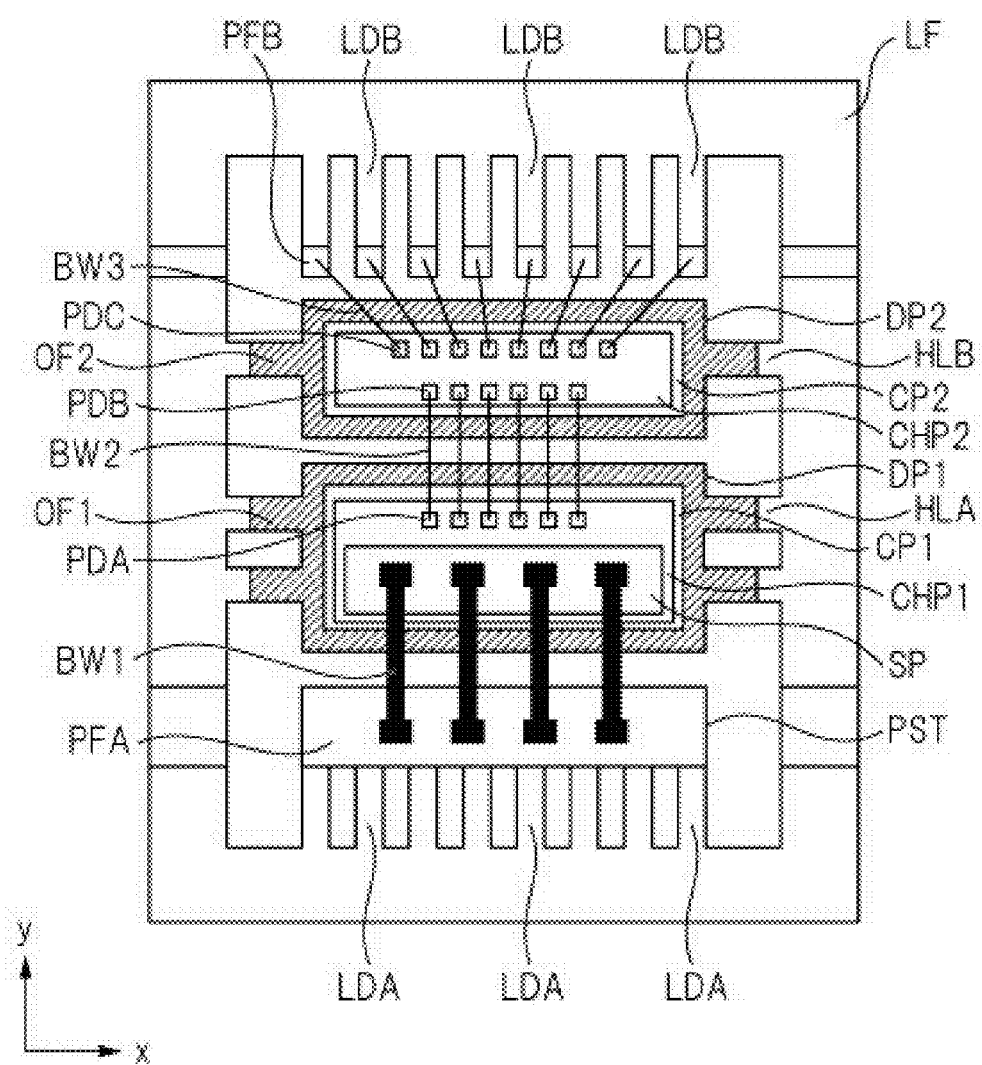
FIG. 20 is a diagram showing the manufacturing process of the semiconductor device followed by FIG. 19.

Next, as shown in FIG. 20, the pad PDA formed on the front surface of the semiconductor chip CHP1 and the pad PDB formed on the front surface of the semiconductor chip CHP2 are connected to each other via a bonding wire BW2. Further, the pad PDC formed on the front surface of the semiconductor chip CHP2 and one end portion of the lead LDB on which the silver plating film PFB is formed are connected to each other via a bonding wire BW3. At this time, the bonding wire BW2 and the bonding wire BW3 are made of a material containing gold as a main component.

Figure 21:
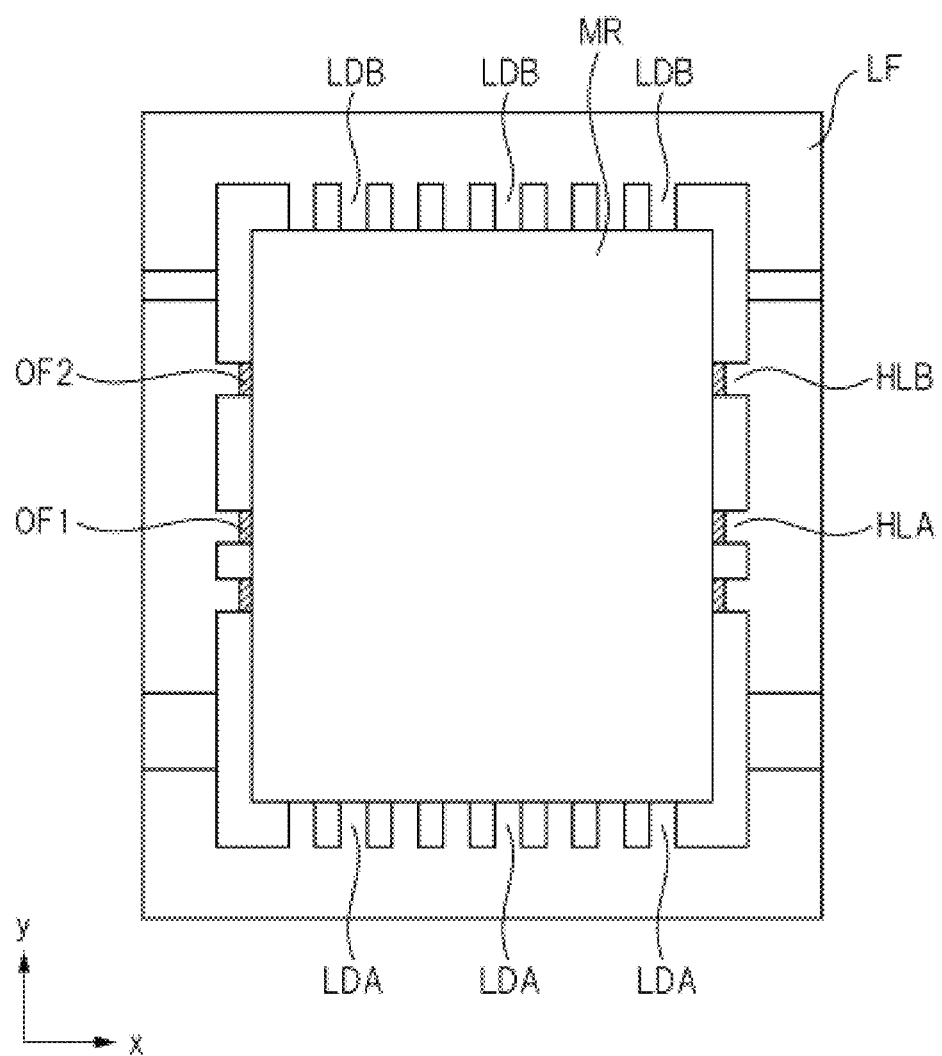
FIG. 21 is a diagram showing the manufacturing process of the semiconductor device followed by FIG. 20.

Next, as shown in FIG. 21, the sealing body MR is formed by resin-sealing (molding). Specifically, at least a portion of each of the semiconductor chip CHP1, the semiconductor chip CHP2, the post portion PST, and the plurality of leads LDA, a portion of each of the plurality of leads LDB including one end portion, and the plurality of bonding wires BW1, BW2, BW3 are sealed with the sealing body MR.

Then, plating layers are formed on the other parts of the lead LDA and the lead LDB exposed from the sealing body MR as needed. Next, outside the sealing body MR, the lead LDA and the lead LDB are cut at predetermined positions. The suspension lead HLA connected to the die pad DP1 and the suspension lead HLB connected to the die pad DP2 are also cut in place. In the suspension lead HLA, an offset portion OF1 is formed, and the suspension lead HLA is cut by the offset portion OF1. Similarly, in the suspension lead HLB, the offset portion OF2 is formed, and the suspension lead HLB is cut by the offset portion OF2.

As described above, the package structure PKG1 can be manufactured.

First Modified Example

<<Configuration of Semiconductor Device>>

Next, a first modified example will be described.

Figure 22:
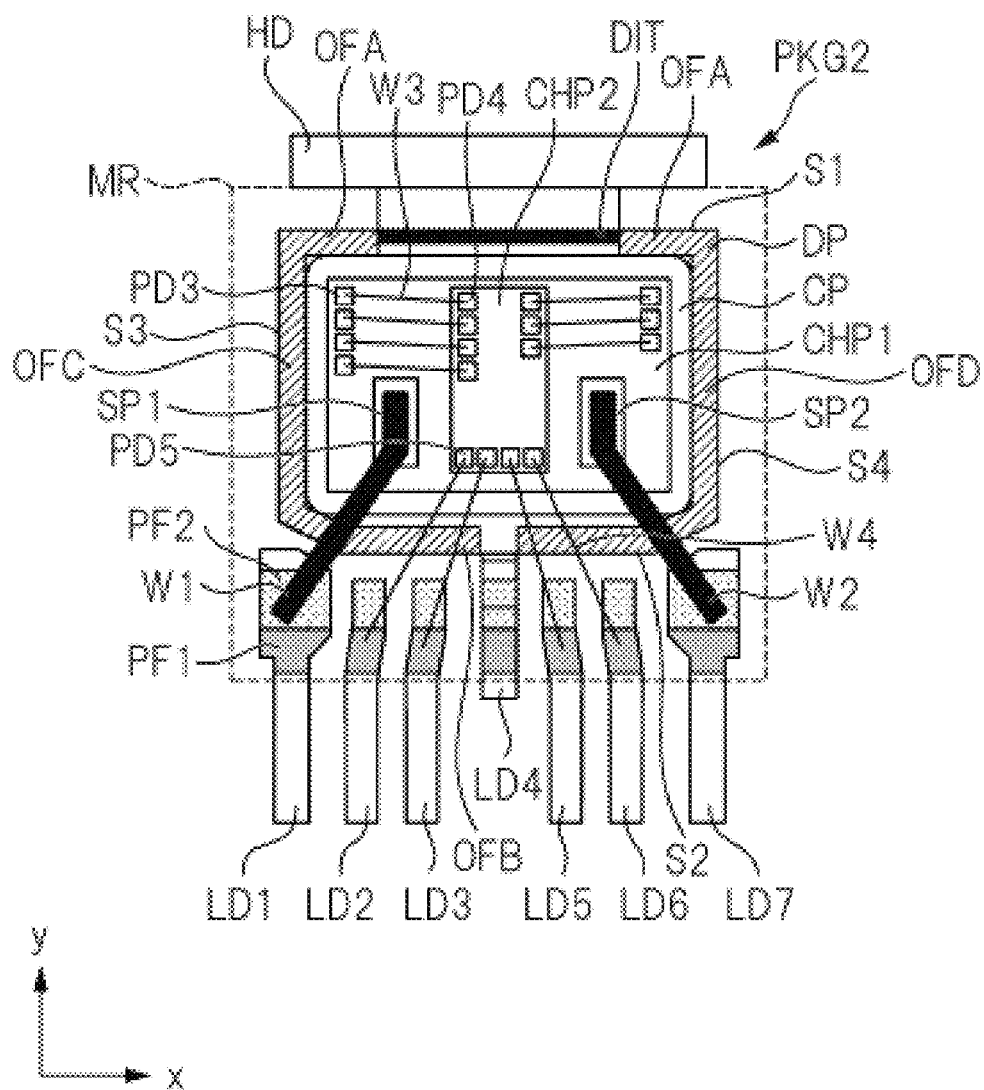
FIG. 22 is a diagram showing a package structure according to a first modified example and showing an upper surface of the package structure seen through a sealing body.

FIG. 22 is a diagram showing a package structure (semiconductor device) PKG2 according to the present first modified example and showing an upper surface of the package structure PKG2 seen through the sealing body MR.

As shown in FIG. 22, the package structure PKG2 has a die pad DP which is a chip mounting portion, and a semiconductor chip CHP1 is mounted on the die pad DP via a conductive adhesive material CP made of solder or silver paste as a raw material. A power transistor is formed in the semiconductor chip CHP1. A semiconductor chip CHP2 is mounted on the semiconductor chip CHP1 via an insulating adhesive material (not shown). A control circuit for controlling the power transistor is formed in the semiconductor chip CHP2.

Next, the surface of the semiconductor chip CHP1 includes a first source pad forming region in which a source pad SP1 is formed, a second source pad forming region in which a source pad SP2 is formed, and a region sandwiched between the first source pad forming region and the second source pad forming region in plan view. Also, a semiconductor chip CHP2 is mounted on the sandwiched region via an insulating adhesive material (not shown).

The source pad SP1 is connected to the lead LD1 via a thick wire W1. On the other hand, the source pad SP2 is connected to the lead LD7 via a thick wire W2. Further, a plurality of pads PD3 is formed on the semiconductor chip CHP1, while a plurality of pads PD4 and a plurality of pads PD5 are formed on the semiconductor chip CHP2. In this case, the plurality of pads PD3 is connected to the plurality of pads PD4, respectively, through a wire W3, and the plurality of pads PD5 is connected to a lead LD2, a lead LD3, a lead LD5 or a lead LD6. The die pad DP is connected to the lead LD4.

Subsequently, as shown in FIG. 22, the outer lead portion of each of from the lead LD1 to the lead LD7 protrudes from the sealing body MR. Here, as shown in FIG. 22, a silver plating film PF1 containing silver as a main component and a nickel plating film PF2 containing nickel as a main component are formed on a partial area of each of from the lead LD1 to the lead LD3, and each of from the lead LD5 to the lead LD7.

The lead LD1 is connected to a nickel plating film PF2 via the thick wire W1, and the lead LD7 is connected to a nickel plating film PF2 via the thick wire W2. On the other hand, the wire W4 is connected to the lead LD2, LD3, LD5, LD6 via a silver plating film PF1.

In FIG. 22, the die pad DP has a first side S1 connected to the header HD, a second side S2 opposite the first side S1, a third side S3 crossing each of the first side S1 and the second side S2, and a fourth side S4 opposite the third side S3. A groove portion (V-shaped groove) DIT is provided along the first side S1 of the die pad DP at the vicinity of a connecting portion of the die pad DP, which is a portion connected to the header HD. On the other hand, an offset portion OFA is provided along the first side S1 of the die pad DP at a non-connecting portion of the die pad PD, which is a portion not connected to the header HD, and an offset portion OFB is also provided along the second side S2 of the die pad DP at a portion of the second side S2. Specifically, the offset portion OFB is provided along the second side S2 of the die pad DP at a non-connecting portion of the die pad PD, which is a portion other than a portion connected to the lead LD4. Further, the offset portion OFC is provided along the third side S3, and the offset portion OFD is provided along the fourth side S4.

As described above, the package structure PKG2 is configured.

Features in First Modified Example

Next, the features of the present first modified example will be described.

A characteristic point of the present first modified example is that, for example, as shown in FIG. 22, there are a region in which each offset portion OFA, OFB, OFC, OFD is provided at the peripheral edge portion of the die pad DP and a region in which the groove portion DIT is provided. Thus, by providing each offset portion OFA, OFB, OFC, OFD in most of the peripheral edge portion of the die pad DP, it is possible to block the wetting spread of the conductive adhesive material CP by these offset portion OFA, OFB, OFC, OFD. Therefore, even if the conductive adhesive material CP is supplied to ensure a constant thickness, overflow of the conductive adhesive material CP from the die pad DP can be suppressed. That is, the purpose of providing each offset portion OFA, OFB, OFC, OFD in the peripheral edge portion of the die pad DP is to prevent the conductive adhesive material CP for mounting the semiconductor chip CHP1 from overflowing from the peripheral edge portion of the die pad DP as a result of the conductive adhesive material CP spreading wet. As described above, in the present modified example, by providing each offset portion OFA, OFB, OFC, OFD in the peripheral edge portion of the die pad DP, each offset portion OFA, OFB, OFC, OFD function as a dam.

In this regard, the present modified example does not provide an offset portion at a connecting portion of the die pad DP, which is a portion connected to the header HD. This takes into account that the connecting portion connected to the header HD is less likely to overflow the conductive adhesive material CP from the die pad DP than the side not connected to the header HD.

However, even in the connecting portion connected to the header HD, if no countermeasure is taken, there is a possibility that the conductive adhesive material CP cannot be held on the die pad DP, and consequently, there is a possibility that the semiconductor chip CHP1 mounted on the die pad DP is inclined. Then, if the semiconductor chip CHP1 is tilted, there is variation in the ON-resistance on the current path between source and drain. In addition, in some cases, voids may be formed in the conductive adhesive material CP. Therefore, in the present first modified example, a groove portion DIT is provided along the first side S1 of the die pad DP at a connecting portion of the die pad, which is a portion connected to the header HD, instead of the dam.

As described above, in the present first modified example, there are a region in which each offset portion OFA, OFB, OFC, OFD is provided at the peripheral edge portion of the die pad DP, and a region in which the groove portion DIT is provided. Accordingly, the overflow of the conductive adhesive material CP can be suppressed at each offset portion OFA, OFB, OFC, OFD, and the possibility that the semiconductor chip CHP1 mounted on the die pad DP is inclined due to the groove portion DIT can be reduced.

Second Modified Example

Next, a second modified example will be described.

Figure 23:
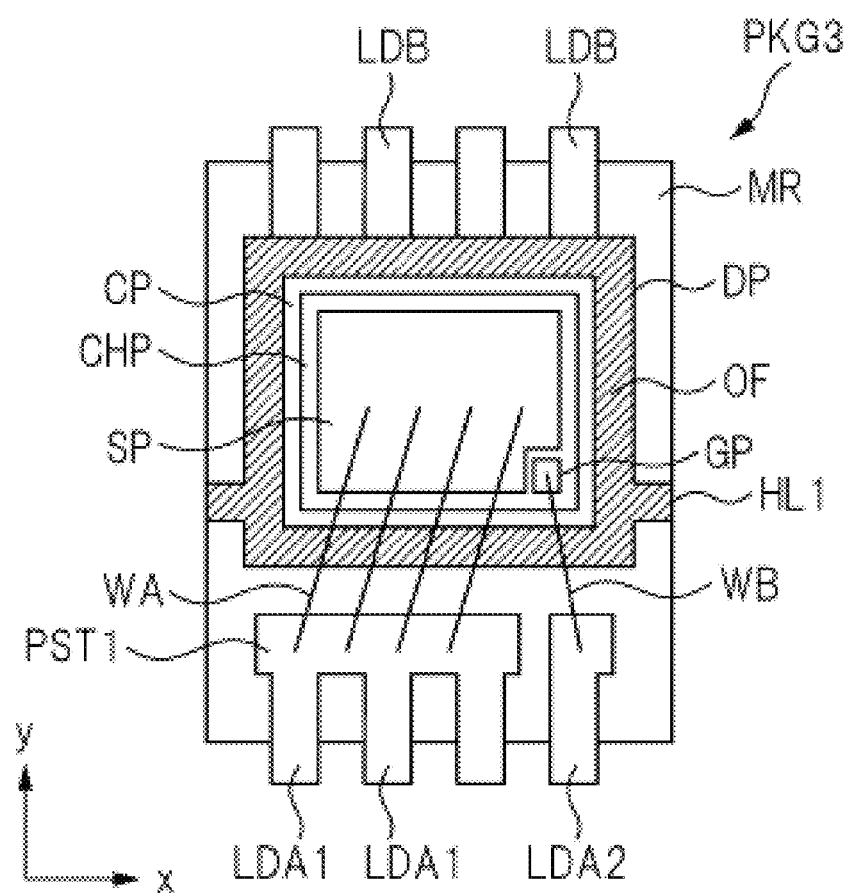
FIG. 23 is a diagram showing a package structure according to a second modified example and showing an upper surface of the package structure seen through a sealing body.

FIG. 23 is a diagram showing a package structure PKG3 according to the present second modified example and showing an upper surface of the package structure PKG3 seen through the sealing body MR.

In FIG. 23, the package structure PKG3 includes a die pad DP that is a chip mounting portion, and a semiconductor chip CHP is mounted on the die pad DP via a conductive adhesive material CP. A power transistor is formed in the semiconductor chip CHP. A source pad SP and a gate pad GP are formed on the surface of the semiconductor chip CHP.

The source pad SP is electrically connected to the plurality of leads LDA1 via the plurality of wires WA. More specifically, the plurality of leads LDA1 spaced apart from the die pad DP is connected to each other via the post portion PST1 as shown in FIG. 23. The source pad SP and the post portion PST1 integrated with the plurality of leads LDA1 are electrically connected to each other via the plurality of wires WA. On the other hand, the gate pad GP is electrically connected to the lead LDA2 spaced apart from the die pad DP via a wire WB. Further, the die pad DP is integrally formed with the lead LDB.

Figure 24A:
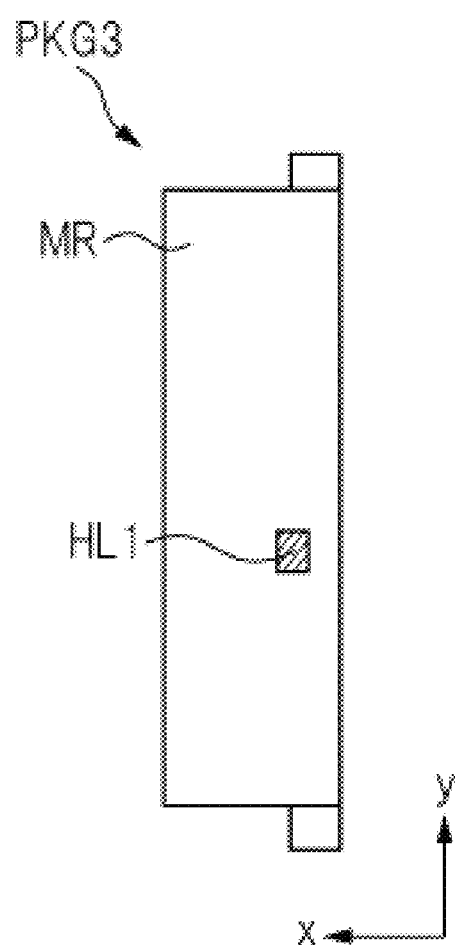
FIG. 24A is a side surface view of the packaging structure in the second modified example.

FIG. 24A is a side surface view of the package structure PKG3. As shown in FIG. 24A, the suspension lead remaining portion HL1 is exposed from the side surface of the sealing body MR. In other words, the suspension lead remaining portion HL1 is exposed from a position spaced apart from the lower surface of the sealing body MR.

Figure 24B:
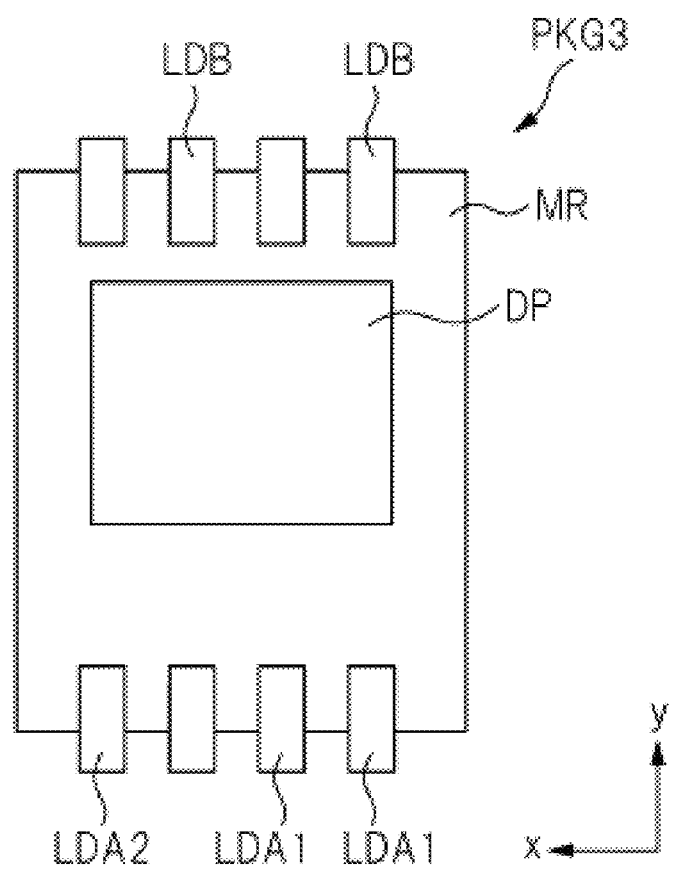
FIG. 24B is a lower surface view of the packaging structure in the second modified example.

Next, FIG. 24B is a lower surface view of the package structure PKG3. As shown in FIG. 24B, the lower surface of the die pad DP is exposed from the rear surface (lower surface) of the sealing body MR. On the other hand, the suspension lead remaining portion HL1 connected to the die pad DP is not exposed from the rear surface of the sealing body MR. As described above, the package structure PKG3 is configured.

In the package structure PKG3 constituted in this way, as shown in FIG. 23, an offset portion OF is provided from the peripheral edge portion of the die pad DP to the suspension lead remaining portion HL1. Therefore, also in the present second modified example, by providing the offset portion OF from the peripheral edge portion of the die pad DP to the suspension lead remaining portion HL1, it is possible to suppress the conductive adhesive material CP from overflowing from the die pad DP, and to mount the semiconductor chip CHP having the largest possible chip size on the die pad DP while securing the connection reliability and the heat dissipation property.

The invention made by the present inventor has been described above in detail based on the embodiment, but the present invention is not limited to the embodiment described above, and it is needless to say that various modifications can be made without departing from the gist thereof.

What is claimed is:

1. A semiconductor device comprising:
   a die pad;
   a lead spaced apart from the die pad;
   a header connected to the die pad;
   a semiconductor chip mounted on the die pad via a conductive adhesive material;
   a conductive member electrically connecting the semiconductor chip and the lead with each other; and
   a sealing body having an upper surface, a lower surface opposite the upper surface and a side surface located between the upper surface and the lower surface, the sealing body sealing the semiconductor chip and the lead such that a part of the die pad is exposed from the lower surface,
   wherein the die pad has:
      a first side connected to the header;
      a second side facing the first side;
      a third side crossing each of the first side and the second side; and
      a fourth side facing the third side,
   wherein a groove portion is provided along the first side of the die pad at a connecting portion of the die pad, the connecting portion of the die pad being a portion connected to the header,
   wherein a first offset portion is provided along the first side of the die pad at a first non-connecting portion of the die pad, the first non-connecting portion of the die pad being a portion not connected to the header,
   wherein a second offset portion is provided along the second side,
   wherein a third offset portion is provided along the third side, and
   wherein a fourth offset portion is provided along the fourth side.

2. The semiconductor device according to claim 1, further comprising:
   a first lead connected to the die pad at the second side of the die pad,
   wherein the second offset portion is provided along the second side of the die pad at a second non-connecting portion of the die pad, the second non-connecting portion of the die pad being a portion not connected to the first lead.

* * * * *